US012015078B2

(12) United States Patent
Liu et al.

(10) Patent No.: US 12,015,078 B2
(45) Date of Patent: Jun. 18, 2024

(54) MANUFACTURING METHOD OF SEMICONDUCTOR POWER DEVICE

(71) Applicant: SUZHOU ORIENTAL SEMICONDUCTOR CO., LTD., Jiangsu (CN)

(72) Inventors: Wei Liu, Suzhou (CN); Zhenyi Xu, Suzhou (CN); Zhendong Mao, Suzhou (CN); Xin Wang, Suzhou (CN)

(73) Assignee: SUZHOU ORIENTAL SEMICONDUCTOR CO., LTD., Jiangsu (CN)

( * ) Notice: Subject to any disclaimer, the term of this patent is extended or adjusted under 35 U.S.C. 154(b) by 0 days.

(21) Appl. No.: 17/622,021

(22) PCT Filed: Nov. 12, 2020

(86) PCT No.: PCT/CN2020/128371
§ 371 (c)(1),
(2) Date: Dec. 22, 2021

(87) PCT Pub. No.: WO2022/082902
PCT Pub. Date: Apr. 28, 2022

(65) Prior Publication Data
US 2023/0268420 A1 Aug. 24, 2023

(30) Foreign Application Priority Data
Oct. 20, 2020 (CN) .......................... 202011127631.1

(51) Int. Cl.
*H01L 29/66* (2006.01)
*H01L 21/308* (2006.01)
(Continued)

(52) U.S. Cl.
CPC .... *H01L 29/66734* (2013.01); *H01L 21/3083* (2013.01); *H01L 29/401* (2013.01);
(Continued)

(58) Field of Classification Search
CPC ........... H01L 29/66734; H01L 29/7813; H01L 29/66719; H01L 29/407; H01L 21/3083
See application file for complete search history.

(56) References Cited

U.S. PATENT DOCUMENTS

| 8,247,298 B2 | 8/2012 | Ohtsuka |
| 9,865,694 B2 | 1/2018 | Lee et al. |

(Continued)

FOREIGN PATENT DOCUMENTS

| CN | 102005377 A | 4/2011 |
| CN | 104103518 A | 10/2014 |

(Continued)

OTHER PUBLICATIONS

PCT/CN2020/128371 International Search Report dated Jul. 21, 2021 (and translation).

*Primary Examiner* — Joseph C. Nicely
(74) *Attorney, Agent, or Firm* — Michael Best & Friedrich LLP

(57) ABSTRACT

A manufacturing method of a semiconductor power device includes the following steps: An n-type substrate is etched in a self-aligning manner using a first insulating layer, a second insulating layer, and a third insulating layer as a mask to form a second groove in the n-type substrate. A fourth insulating layer and a gate are formed in the second groove.

9 Claims, 5 Drawing Sheets

(51) Int. Cl.
  *H01L 29/40*   (2006.01)
  *H01L 29/78*   (2006.01)
(52) U.S. Cl.
  CPC ...... *H01L 29/407* (2013.01); *H01L 29/66719* (2013.01); *H01L 29/7813* (2013.01)

(56)         References Cited

U.S. PATENT DOCUMENTS

| | | | |
|---|---|---|---|
| 2013/0069144 A1* | 3/2013 | Mathew | H01L 29/7827 438/270 |
| 2013/0292759 A1* | 11/2013 | Mathew | H01L 29/7827 257/330 |
| 2017/0098695 A1* | 4/2017 | Chen | H01L 29/7813 |
| 2019/0296147 A1* | 9/2019 | Kawamura | H01L 29/66734 |

FOREIGN PATENT DOCUMENTS

| | | | | |
|---|---|---|---|---|
| CN | 104658901 A | | 5/2015 | |
| CN | 104779166 A | | 7/2015 | |
| CN | 104916544 A | | 9/2015 | |
| CN | 109979823 A | | 7/2019 | |
| CN | 110137249 A | | 8/2019 | |
| CN | 111477550 A | | 7/2020 | |
| KR | 20110027719 A | * | 3/2011 | ......... H01L 29/7855 |

\* cited by examiner

MANUFACTURING METHOD OF SEMICONDUCTOR POWER DEVICE

CROSS-REFERENCE TO RELATED APPLICATION(S)

This is a national stage application filed under 37 U.S.C. 371 based on International Patent Application No. PCT/CN2020/128371, filed Nov. 12, 2020, which claims priority to Chinese Patent Application No. 202011127631.1 filed with the China National Intellectual Property Administration (CNIPA) on Oct. 20, 2020, the disclosure of which is incorporated herein by reference in its entirety.

TECHNICAL FIELD

The present application belongs to the field of semiconductor power device technology, for example, a manufacturing method of a semiconductor power device.

BACKGROUND

A manufacturing method of a semiconductor power device in a related art includes the following steps: A hard mask layer is formed on a provided silicon substrate. The position of a groove is defined by a photolithography process. Then the hard mask layer at a groove position is etched off. The silicon substrate is etched using the etched hard mask layer as a mask to form the groove. The bottom surface of the groove and the side of the groove are covered to form a first dielectric layer. A first polysilicon layer is deposited. The first polysilicon layer completely fills the groove formed with the first dielectric layer, and extends to the outside of the groove. Polysilicon is etched back to remove the first polysilicon layer located outside the groove. The remaining first polysilicon layer after etching forms a shield gate. The first dielectric layer is etched in a self-aligning manner using the silicon on the side of the groove and the first polysilicon layer as a self-aligning boundary. Self-aligning etching removes the first dielectric layer at the top of the groove and retains the first dielectric layer at the bottom of the groove. Moreover, the retained first dielectric layer is located at the bottom of a subsequently formed body region. A fourth insulating layer is formed on the interior surface of the top area of the groove after the first dielectric layer is removed. The thickness of the fourth insulating layer is less than the thickness of the first dielectric layer. A second polysilicon layer is deposited. The second polysilicon layer completely fills the top area of the groove where the fourth insulating layer is formed after the first dielectric layer is removed. The polysilicon is etched back to remove the second polysilicon layer located outside the groove. The remaining second polysilicon layer after etching forms a polysilicon gate. In the manufacturing method of a semiconductor power device in the related art, it is necessary to form the first dielectric layer with sufficient thickness in order to ensure the quality of the polysilicon gate. But the thickness of the first dielectric layer affects the charge depletion at the bottom of the groove. Therefore, the withstand voltage of the semiconductor power device is affected.

SUMMARY

The present application provides a manufacturing method of a semiconductor power device, which can ensure the quality of the gate, and do not affect the withstand voltage of the semiconductor power device.

In the first aspect, the present application provides a manufacturing method of a semiconductor power device which includes the steps described below.

A first insulating layer is formed on an n-type substrate. The first insulating layer is etched to form an opening.

An insulating sidewall is formed in the opening.

The n-type substrate is etched using the first insulating layer and the insulating sidewall as a mask to form a first groove in the n-type substrate.

A second insulating layer and a shield gate are formed in the first groove.

A third insulating layer is formed on the surface of the shield gate.

The insulating sidewall is etched off. The n-type substrate is etched using the first insulating layer, the second insulating layer, and the third insulating layer as the mask to form a second groove in the n-type substrate.

Optionally, the manufacturing method of a semiconductor power device according to the present application further includes the steps described below.

A fourth insulating layer and a gate are formed in the second groove. The gate is isolated from the shield gate by the second insulating layer.

The first insulating layer and the third insulating layer are etched off.

A p-type body region is formed in the n-type substrate.

An n-type source region is formed in the p-type body region.

Optionally, the manufacturing method of a semiconductor power device according to the present application further includes the steps described below.

The first insulating layer, the third insulating layer, and a part of the second insulating layer which is located at the position of the sidewall of the second groove are etched off.

The fourth insulating layer and the gate are formed in the second groove. The gate is isolated from the shield gate by the fourth insulating layer.

The p-type body region is formed in the n-type substrate.

The n-type source region is formed in the p-type body region.

Optionally, in the manufacturing method of a semiconductor power device according to the present application, the first insulating layer includes a silicon oxide layer.

Optionally, in the manufacturing method of a semiconductor power device according to the present application, the second insulating layer is the silicon oxide layer.

Optionally, in the manufacturing method of a semiconductor power device according to the present application, the third insulating layer is the silicon oxide layer.

Optionally, in the manufacturing method of a semiconductor power device according to the present application, the insulating sidewall is a silicon nitride layer.

Optionally, in the manufacturing method of a semiconductor power device according to the present application, an etching method combining anisotropic etching and isotropic etching is performed when the second groove is formed by etching.

Optionally, in the manufacturing method of a semiconductor power device according to the present application, the depth of the second groove is less than the depth of the first groove.

In the manufacturing method of a semiconductor power device according to the present application, the first groove is formed by one photolithography process, the n-type substrate is etched in a self-aligning manner using the first insulating layer, the second insulating layer, and the third insulating layer as the mask to form the second groove in the n-type substrate, and the fourth insulating layer and the gate are formed in the second groove. In the manufacturing method of a semiconductor power device according to the present application, the quality of the gate formed is not limited by the thickness of the second insulating layer. Moreover, not only the quality of the gate is ensured, but also the thickness of the second insulation layer can be reduced. Therefore, the withstand voltage of the semiconductor power device is not affected.

DETAILED DESCRIPTION

Figure 1:
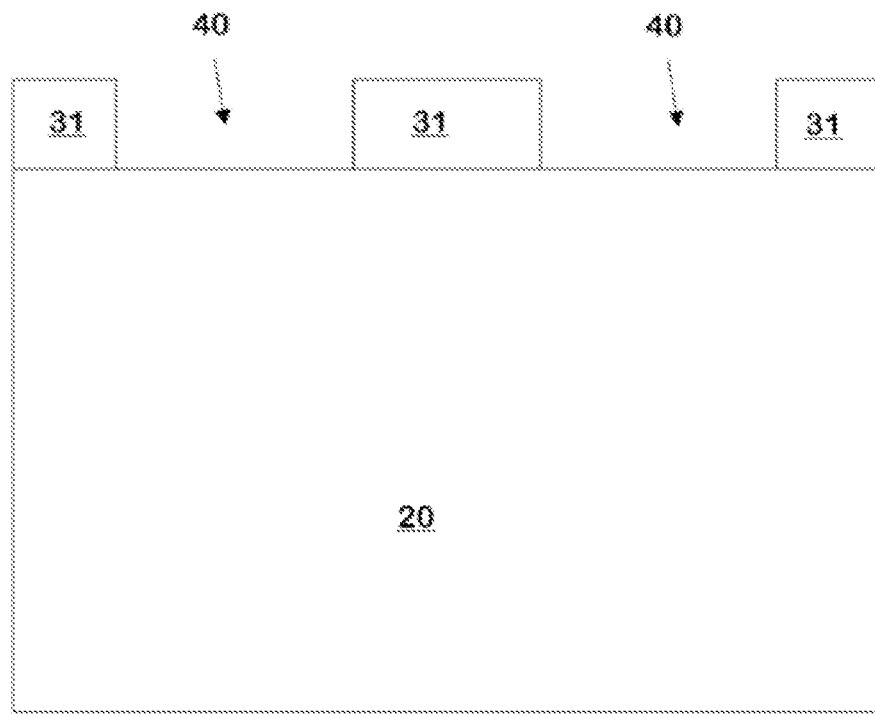
FIGS. 1 to 6 are sectional views illustrating the main structures in the manufacturing process of the manufacturing method of a semiconductor power device of one embodiment of the present application.

The solutions of the present application are described completely hereinafter in conjunction with the drawings in the embodiment of the present application. Apparently, the described embodiment is part, not all, of embodiments of the present application. Meanwhile, to illustrate the embodiment of the present application clearly, in the views illustrated in the drawings of the description, the thickness of layers and regions described in the present application are enlarged, and the sizes of the graphics illustrated in the drawings do not represent the actual dimensions.

FIGS. 1 to 6 are sectional views illustrating the main structures of the manufacturing method in the manufacturing process of a semiconductor power device of one embodiment of the present application.

First, as shown in FIG. 1, the first insulating layer 31 is formed on the provided n-type substrate 20. The n-type substrate 20 is usually an n-type silicon substrate. The first insulating layer 31 includes the silicon oxide layer. For example, the first insulating layer 30 may be the silicon oxide layer or the lamination of silicon oxide layer—silicon nitride layer—silicon oxide layer. The position of the opening is defined by the photolithography process. Then the first insulating layer 31 is etched to form at least one opening 40 in the first insulating layer 31. The number of the opening 40 is determined by the specification of the designed semiconductor power device. For example, merely two openings 40 are shown in this embodiment of the present application.

Figure 2:
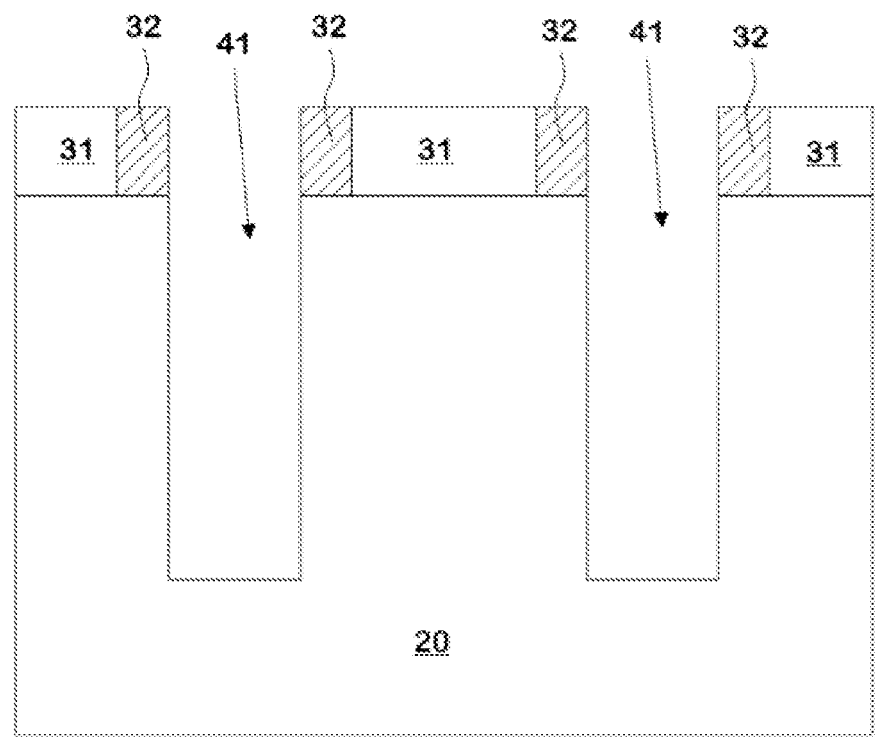

Next, as shown in FIG. 2, the insulating sidewall 32 is formed in the opening of the first insulating layer 31. Optionally, the insulating sidewall 32 may be the silicon nitride layer. For example, the process includes the following steps: First, a silicon nitride layer is deposited. Then, the deposited silicon nitride layer is etched back. With this configuration, the insulating sidewall 32 is formed in the self-aligning manner at the position of the sidewall of the opening 40. After the insulating sidewall 32 is formed, the n-type substrate 20 is etched using the first insulating layer 31 and the insulating sidewall 32 as the mask to form the first groove 41 in the n-type substrate 20.

Figure 3:
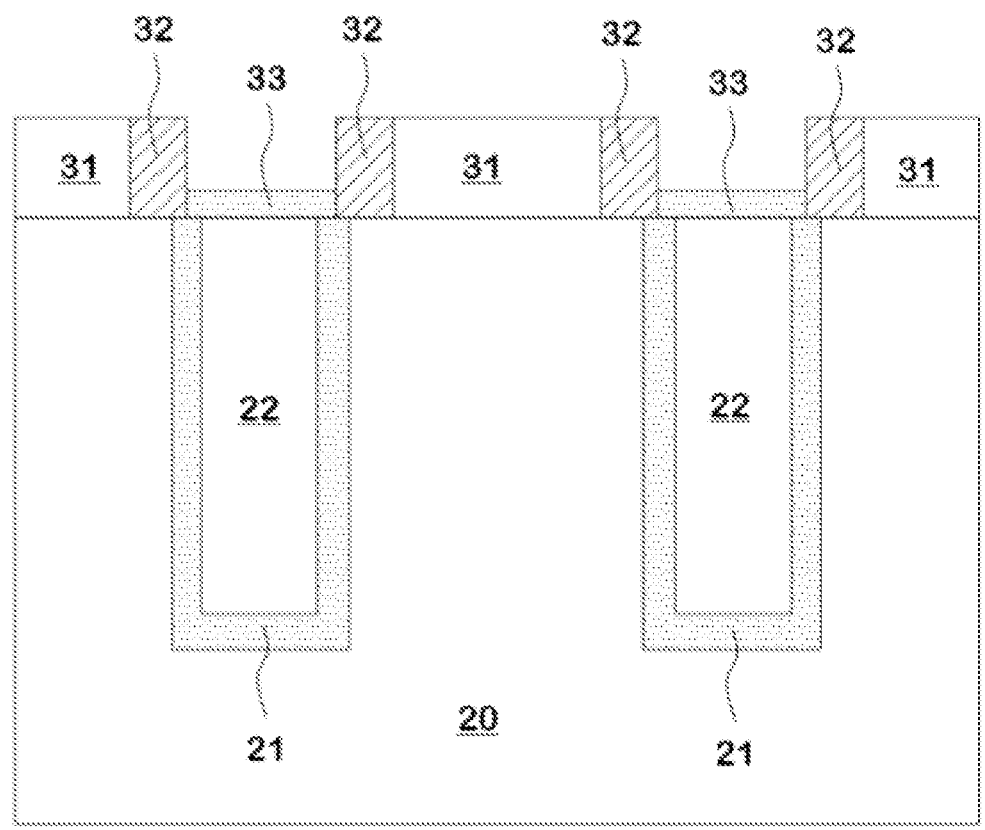

Next, as shown in FIG. 3, the second insulating layer 21 and the shield gate 22 are formed in the first groove. Optionally, the second insulating layer 21 may be the silicon oxide layer formed by a process of thermal oxidation. The shielding gate 22 is generally a polysilicon gate. A forming process includes the following steps: After the second insulating layer 21 is formed, a layer of polysilicon is deposited. Then, the deposited polysilicon layer is etched back. The remaining polysilicon layer after etching forms the shield gate 22. After the shield gate 22 is formed, the third insulating layer 33 is formed on the surface of the shield gate 22. Optionally, the third insulating layer 33 may be the silicon oxide layer formed by the process of thermal oxidation. At this time, the third insulating layer 33 and the second insulating layer 21 are connected. Consequently, the shield gate 22 is wrapped by the second insulating layer 21 and the third insulating layer 33.

Figure 4:
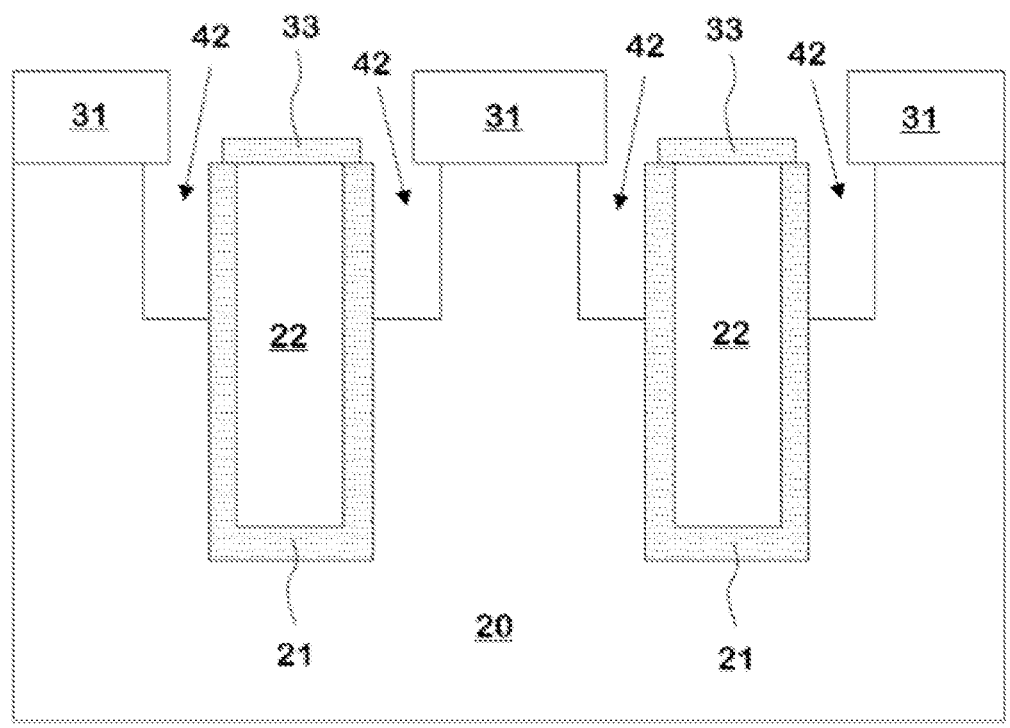

Next, as shown in FIG. 4, the insulating sidewall is etched off. The n-type substrate 20 is etched in the self-aligning manner using the first insulating layer 31, the second insulating layer 21, and the third insulating layer 33 as the mask to form the second groove 42 in the n-type substrate 20. The depth of the second groove 42 is less than the depth of the first groove. The etching method combining anisotropic etching and isotropic etching is performed when the second groove 42 is formed by etching. In this manner, the width of the second groove 42 may be increased. As a result, the width of the second groove 42 is greater than the width of the insulating sidewall previously formed. As a result, the width of the gate formed later is increased. Therefore, the gate may be more easily extracted.

It is to be noted that the thickness of the oxidized n-type substrate 20 at the position of the sidewall of the first groove is made less than the thickness of the insulating sidewall when the second insulating layer 21 is formed by the thermal oxidation process. Therefore, it is ensured that the n-type substrate 20 is exposed after the insulating sidewall is etched off. In this manner, the n-type substrate 20 may be etched to form the second groove 42.

Figure 5:
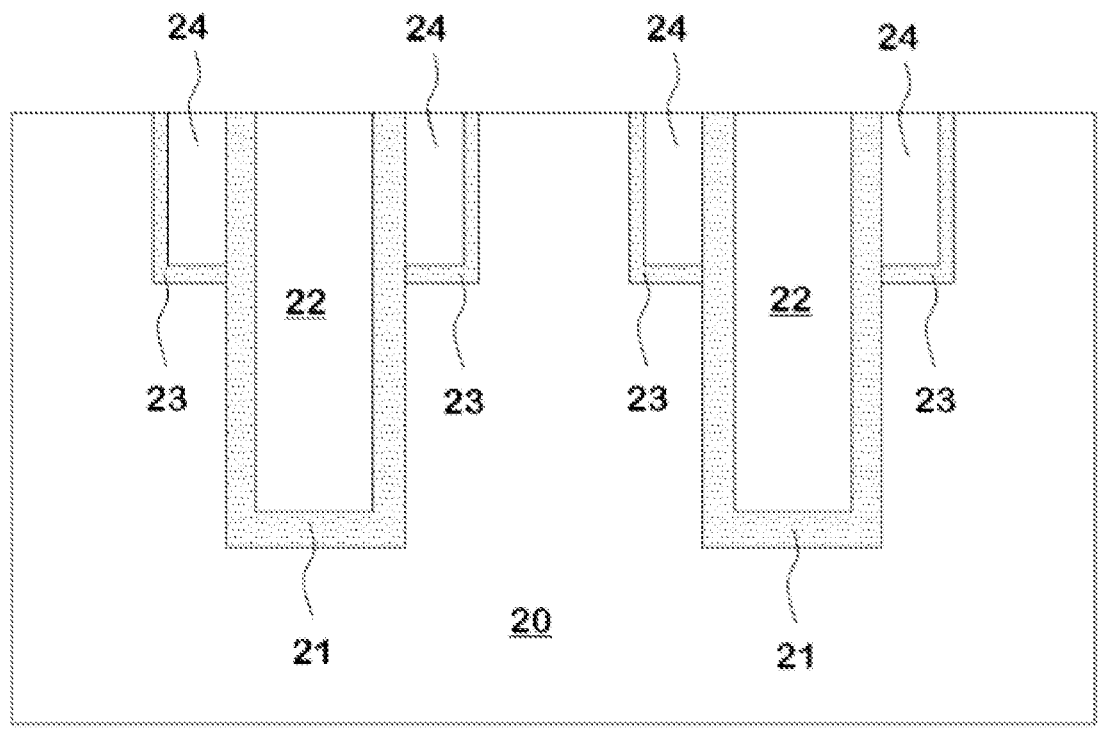

Next, as shown in FIG. 5, the fourth insulating layer 23 is formed in the second groove. The fourth insulating layer 32 is usually the silicon oxide layer formed by the process of thermal oxidation. Then the gate 24 is formed in the second groove. The forming process includes the following steps: A layer of polysilicon is deposited. Then, the deposited polysilicon layer is etched back. The remaining polysilicon layer after etching forms the gate 24. The gate 24 is isolated from the shield gate 22 by the second insulating layer 21. Then the first insulating layer and the third insulating layer are etched off.

Figure 6:
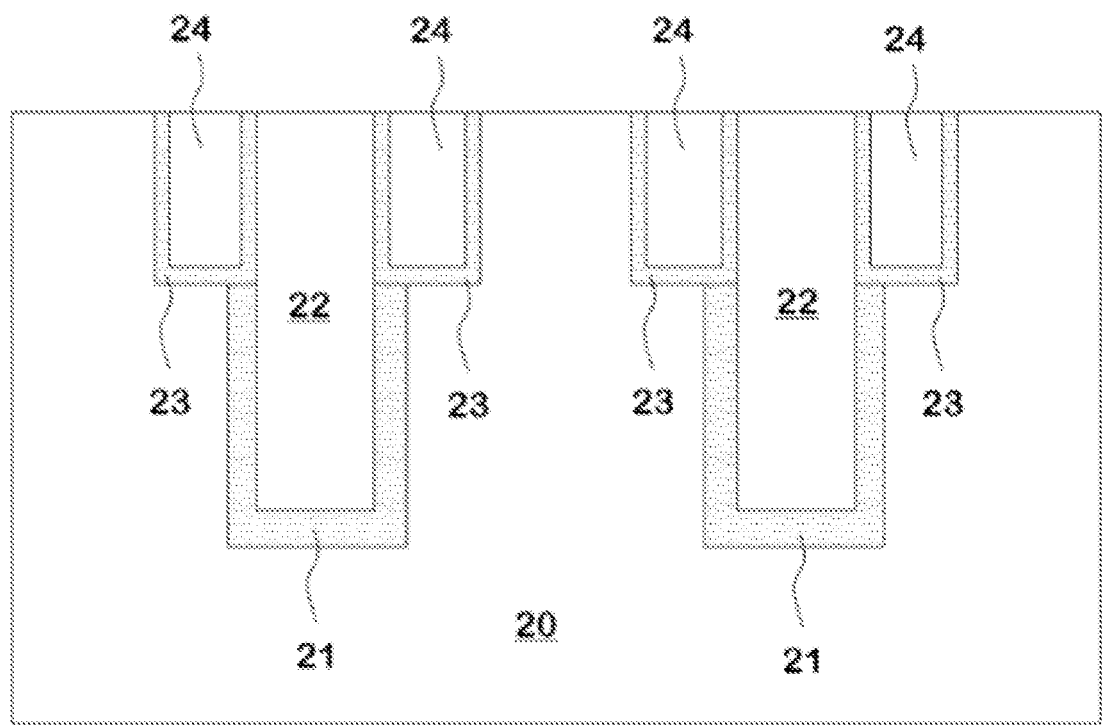

Optionally, after the second groove is formed, the first insulating layer, the third insulating layer, and a part of the second insulating layer 21 which is at the position of the sidewall of the second groove may be etched off. Then the fourth insulating layer 23 is formed by the process of thermal oxidation. At this time, the fourth insulating layer 23 is also formed on the exposed sidewall of the shield gate 22. As shown in FIG. 6, after the gate 24 is formed, the gate 24 is isolated from the shield gate 22 by the fourth insulating layer 23. At this time, the gate 24 has a greater width. Therefore, the gate may be more easily extracted by an external electrode.

Next, according to a conventional process, the p-type body region is formed in the n-type substrate. The n-type source region is formed in the p-type body region. Then the semiconductor power device may be obtained with the arrangement in which an isolation dielectric layer, a metal layer and the like are formed.

In the manufacturing method of a semiconductor power device according to the present application, the first groove is formed by one photolithography process, a shield gate structure is formed in the first groove, then the n-type substrate is etched in the self-aligning manner using the first insulating layer, the second insulating layer, and the third insulating layer as the mask to form the second groove in the n-type substrate, and the fourth insulating layer and the gate are formed in the second groove. With this configuration, in the manufacturing method of a semiconductor power device according to the present application, the gates are formed in the second grooves on two sides of the first groove. The quality of the gate formed is not limited by the thickness of the second insulating layer. Moreover, not only the quality of the gate is ensured, but also the thickness of the second insulation layer can be reduced. Therefore, the withstand voltage of the semiconductor power device is not affected.

What is claimed is:

1. A manufacturing method of a semiconductor power device, comprising:
    forming a first insulating layer on an n-type substrate and etching the first insulating layer to form an opening;
    forming an insulating sidewall in the opening;
    etching the n-type substrate using the first insulating layer and the insulating sidewall as a mask to form a first groove in the n-type substrate;
    forming a second insulating layer and a shield gate in the first groove;
    forming a third insulating layer on a surface of the shield gate;
    etching off the insulating sidewall; and etching the n-type substrate using the first insulating layer, the second insulating layer, and the third insulating layer as a mask to form a second groove in the n-type substrate.

2. The method of claim 1, further comprising:
    forming a fourth insulating layer and a gate in the second groove such that the gate is isolated from the shield gate by the second insulating layer;
    etching off the first insulating layer and the third insulating layer;
    forming a p-type body region in the n-type substrate; and
    forming an n-type source region in the p-type body region.

3. The method of claim 1, further comprising:
    etching off the first insulating layer, the third insulating layer, and a part of the second insulating layer which is located at a position of a sidewall of the second groove;
    forming a fourth insulating layer and a gate in the second groove such that the gate is isolated from the shield gate by the fourth insulating layer;
    forming a p-type body region in the n-type substrate; and
    forming an n-type source region in the p-type body region.

4. The method of claim 1, wherein the first insulating layer comprises a silicon oxide layer.

5. The method of claim 1, wherein the second insulating layer is a silicon oxide layer.

6. The method of claim 1, wherein the third insulating layer is a silicon oxide layer.

7. The method of claim 1, wherein the insulating sidewall is a silicon nitride layer.

8. The method of claim 1, wherein an etching method combining anisotropic etching and isotropic etching is performed when the second groove is formed by etching.

9. The method of claim 1, wherein a depth of the second groove is less than a depth of the first groove.

* * * * *